United States Patent [19]
Tsuru et al.

[11] Patent Number: 5,688,408
[45] Date of Patent: Nov. 18, 1997

[54] MULTILAYER PRINTED WIRING BOARD

[75] Inventors: Yoshiyuki Tsuru, Shimodate; Shigeharu Arike, Shimotsuga; Takashi Sugiyama, Shimodate; Shinjirou Miyashita, Shimodate; Takayuki Suzuki, Shimodate, all of Japan

[73] Assignee: Hitachi Chemical Company Ltd., Tokyo, Japan

[21] Appl. No.: 674,876

[22] Filed: Jul. 2, 1996

Related U.S. Application Data

[62] Division of Ser. No. 418,443, Apr. 7, 1995, Pat. No. 5,562,971.

[30] Foreign Application Priority Data

Apr. 19, 1994 [JP] Japan ................................ 6-080315

[51] Int. Cl.$^6$ ........................................ B44C 1/22
[52] U.S. Cl. .................... 216/17; 216/18; 216/33; 216/39
[58] Field of Search ................... 216/17, 18, 20, 216/33, 39, 41, 56; 29/846, 852

[56] References Cited

U.S. PATENT DOCUMENTS 3,947,957 4/1976 Luttmer .............................. 216/18 X
4,420,364 12/1983 Nukii et al. ........................ 216/17 X

*Primary Examiner*—William Powell
*Attorney, Agent, or Firm*—Antonelli, Terry, Stout & Kraus, LLP.

[57] ABSTRACT

A process for forming a multilayer printed wiring board comprising integrally laminating a plurality of insulating circuit boards having circuits formed on insulating substrates and interlaminar insulating layers sandwiched between adjacent insulating circuit boards, and forming via holes for making electrical connection between two or more layers of circuits. Where the difference between the glass transition point of an interlaminar insulating layer and that of the adjoining insulating substrate is not greater than 60° C., proof against exfoliation due to heat history of the board and high reliability of insulation and through-hole connection is achieved. The interlaminar insulating layers desirably are B-staged and have a B-stage resin flow of less than 1%.

30 Claims, 13 Drawing Sheets

THROUGH-HOLE  SEMICONDUCTOR CHIP

SEMICONDUCTOR CHIP

SPOT FACING WORKING PORTION
71 FIRST SUBSTRATE

723 OPENING
72 FIRST INSULATING LAYER

732 INTERNAL CIRCUIT    731 TERMINAL
733 OPENING    73 SECOND SUBSTRATE

743 OPENING
74 SECOND INSULATING LAYER

753 OPENING
75 THIRD SUBSTRATE

763 OPENING
76 THIRD INSULATING LAYER

77 FOURTH SUBSTRATE

OPENING HAVING THE SAME SIZE AS CAVITY

# MULTILAYER PRINTED WIRING BOARD

This application is a Divisional application of application Ser. No. 418,443, filed Apr. 7, 1995, U.S. Pat. No. 5,562,971.

BACKGROUND OF THE INVENTION

The present invention relates to a multilayer printed wiring board, particularly one used for semiconductor chip package, and a process for producing such a wiring board.

Multilayer printed wiring board usually comprises an insulating substrate, a power layer, a ground layer, circuit conductors formed on the surface thereof, inner layer circuits, via holes or through-holes for making electrical connection of the circuits in the respective layers, and solder resists for insulating the surface circuits.

Various methods are available for the manufacture of multilayer printed wiring boards such as mentioned above. For example, a method is popularly known which comprises forming the inner circuits and interlayer circuit boards including a power layer and a ground layer by etching away unnecessary parts of the copper foil of a copper-clad laminate, placing thereon a prepreg and a copper foil in layers, integrally laminating them by heating under pressure, forming openings at the parts where electrical connection is to be made, metallizing the inner walls of said openings by electroless plating or other means, etching away the unnecessary parts of the copper foil on the surface, then coating a solder resist thereon and drying the same.

In another commonly practiced method, the inner layer circuits of the respective layers are formed separately and positioned by using guide pins, and after integral lamination, the through-holes, outer layer circuits and solder resist are formed.

Regarding semiconductor chip packages, Japanese Patent Application Kokai (Laid-Open) [JP-A-] No. 59-158579 discloses a leadless chip carrier in which the terminals connected to semiconductor chips are extended out from the inside to a part on the outside of the package.

Japanese Patent Application Kokoku (Publication) [JP-B-] No. 58-11100 discloses a pin grid array having a plurality of terminal pins for connection to the through-holes in other package-carrying wiring boards, and a process for producing such an array. This patent also presents a ball grid array in which solder balls are fused to the lands instead of pins in the pin grid array to make electrical connection by soldering.

JP-B-58-26828 discloses a tape automatic carrier constituted by first forming the terminal strips and then insulating them with a tape-like insulating film.

In most of these semiconductor chip packages (hereinafter referred to as "chip carriers"), a ceramic material has been used for insulators and electrical connection of these chip carriers to semiconductor chip terminals has been made by wire bonding. Organic insulating material has been used as sealant for protecting the semiconductor chips and electrical connections from the environment after the semiconductor chips have been mounted on said chip carriers.

Recently, in view of economical disadvantages of ceramic chip carriers due to the increased number of steps for calcination, there have been developed chip carrier producing methods incorporating the ordinary multilayer wiring board manufacturing techniques using an organic insulating material. For instance, a method for producing pin grid array packages is disclosed in JP-B-3-25023.

Necessity has become acute recently for increased density of wiring and size reduction of wiring boards to meet the request for smaller size and functional multiplication of electronic devices. Smaller thickness is also required of the insulators used for interlayer insulation between the inner layer circuits. The conventional prepregs using woven or non-woven glass fabrics are capable of answering to such request for size reduction, and it is therefore attempted to apply an insulating resin or to use a film of insulating resin.

However, when an insulator not containing a reinforcement such as woven or non-woven glass fabrics is used for interlayer insulation, the produced laminate becomes more likely to suffer exfoliation or generation of voids due to heat history of the adjoining insulating layers.

This phenomenon tends to occur particularly when the through-holes are formed in the multilayer wiring board or when many via holes are formed in the layers containing no reinforcement such as woven or non-woven glass fabrics.

SUMMARY OF THE INVENTION

The present invention has for its object to provide a multilayer printed wiring board which is proof against exfoliation of laminations due to heat history of the board and has high reliability of insulation and electrical connection by through-holes, and a process for producing such a multilayer printed wiring board.

The present invention provides a multilayer printed wiring board comprising a plurality of interlaminar insulating layers, a plurality of insulating substrates containing a reinforcement, circuits formed on the surfaces of said insulating substrates, and via holes for making electrical connection between at least two layers of circuits, wherein said via holes run through the two layers of insulating substrates and the interlaminar insulating layer disposed therebetween, said interlaminar insulating layers being the layers not containing a reinforcement, and further characterized in that the B-stage resin flow of said insulating layers is less than 1%, and that the difference between the glass transition point of said interlaminar insulating layer and that of the insulating substrate adjacent thereto is not greater than 60° C.

The present invention also provides a process for producing a multilayer printed wiring board, which comprises integrally laminating, by heating under pressure, B-staged interlaminar insulating layers and insulating circuit boards having circuits formed on the reinforcement-containing insulating substrates, and forming via holes for electrical connection between two or more layers of circuits, wherein said via holes run through two layers of insulating substrates and the interlaminar insulating layer disposed therebetween, said interlaminar insulating layers being the insulating layers not containing a reinforcement, and further characterized in that the B-stage resin flow of said insulating layers is less than 1%, and that the difference between the glass transition point of said interlaminar insulating layer and that of the insulating substrate adjacent thereto is not greater than 60° C.

DESCRIPTION OF THE PREFERRED EMBODIMENTS

Figure 1:
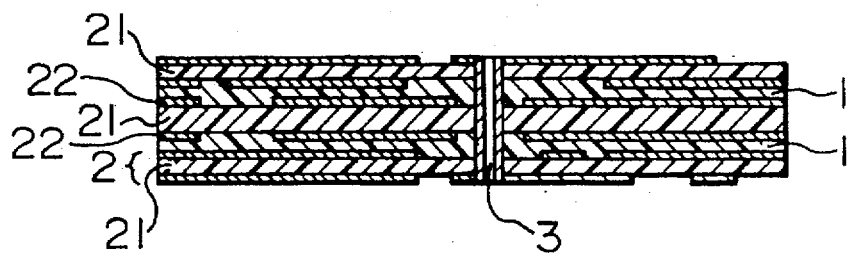
FIG. 1 is a diagrammatic sectional view for illustrating the structural features of the present invention.

The multilayer printed wiring board according to the present invention comprises a plurality of interlaminar insulating layers, a plurality of insulating substrates containing a reinforcing material and laminated alternately, circuits formed on the surfaces of said insulating substrates, and via holes for making electrical connection between two or more layers of circuits, wherein said via holes run through two layers of insulating substrates and the interlaminar insulating layer formed therebetween, said interlaminar insulating layers being the insulating layers not containing a reinforcement, and further characterized in that the B-stage resin flow of said insulating layers is less than 1%, and that the difference between the glass transition point of the interlaminar insulating layer and that of the insulating substrate adjacent thereto is not greater than 60° C.

Regarding the materials of the interlaminar insulating layers and the adjoining insulating substrates used in the present invention, the glass transition point of these materials is investigated and those having the above-defined difference (not greater than 60° C.) in glass transition point are selected and used for the adjoining laminations. The difference in glass transition point is preferably not greater than 40° C.

With reference to said interlaminar insulating layers and insulating substrates, it is also desirable that the difference in glass transition point between the one with the highest glass transition point and the one with the lowest glass transition point is not greater than 30° C.

Since no reinforcing fiber is contained in the interlaminar insulating layers, it is desirable that the insulating substrates used in the present invention comprise reinforcing fiber such as glass cloth, glass paper, glass short fiber or the like impregnated with an appropriate resin such as epoxy resin, polyimide resin or the like for inhibiting change of size due to heat history in the course of working.

In case of using a polymeric epoxy-type adhesive film AS-3000 (trade name, available from Hitachi Chemical Co., Ltd.) for the interlaminar insulating layers, since the glass transition point of this insulator is 105°–130° C., the material usable for the insulating substrates disposed adjacent to said respective insulating layers is one having a glass transition point of 70°–165° C. Examples of such material are a polymeric polyimide-type adhesive film AS-3000 (mentioned above), an epoxy resin-impregnated prepreg GEA-67 (trade name, available from Hitachi Chemical Co., Ltd.) and an epoxy solder resist CCR-506 (trade name, available from Asahi Chemical Laboratory, Ltd.).

In case of using a polyimide-type adhesive film AS-2250 or 2210 (trade name, available from Hitachi Chemical Co., Ltd.) for the interlaminar insulating layers, since the glass transition point of this insulator is 165°–170° C., the material usable for the adjoining insulating substrates is one having a glass transition point of 110°–225° C. Examples of such material are a polyimide-type adhesive film AS-2250 or 2210 (mentioned above), an epoxy resin-impregnated prepreg GEA-679 (trade name, available from Hitachi Chemical Co., Ltd.) and a heat resistant thermosetting BT resin (containing triazine component and bismaleimide component as fundamental components)-type prepreg GHPL-830 (trade name, available from Mitsubishi Gas Chemical Co., Ltd.).

In case of using an epoxy solder resist CCR-506 (mentioned above) for the interlaminar insulating layers, since the glass transition point of this insulating material is 100°–115° C., the material usable for the adjoining insulating layers is one having a glass transition point of 55°–160° C., such as an epoxy solder resist CCR-506 (mentioned above), a polymeric polyimide-type adhesive film AS-3000 (mentioned above), an epoxy resin-impregnated prepreg GEA-67 (mentioned above) and the like.

When insulating material of the same system is used for both of the interlaminar insulating layers and insulating substrates, there is no other alternative but to apply said material in the state of varnish on the surface of the insulating circuit board. In this case, as it is required to satisfy both requirements of controlled coating thickness and reduction of coating thickness at the same time, there are involved technical difficulties and complication of the production process.

For such control of coating thickness and reduction thereof, there can be used solder resist ink generally employed in the manufacture of wiring boards, and the type of ink to be used can be properly selected in consideration to the above-defined range of glass transition point.

More preferably, a varnish is applied on the support film and dried into an adhesive film so that said layers can be used in the B-stage state.

As for the properties of said interlaminar insulating layers containing no reinforcement such as woven or nonwoven glass fabrics, it is desirable that the B-stage resin flow of said layers is less than 1%, and the B-stage viscoelasticity of said layers is in the range of 2,000–5,000 MPa at 30° C. and in the range below 10 MPa at the molding temperature.

The layer materials satisfying these requirements include polymeric epoxy film, polyimide film and epoxy solder resist ink. As the film in the state of B stage, there can be used, for example, such commercial products as AS-3000 (polymeric epoxy adhesive film) and AS-2250 and 2210 (polyimide adhesive film, both mentioned above).

As the polyimide adhesive film material, there can be used a thermosetting resin comprising 40–70% by weight of a polyimide having the structure represented by the following formula (1), 14–45% by weight of a bismaleimide-diamine reaction product and 15–45% by weight of an epoxy resin:

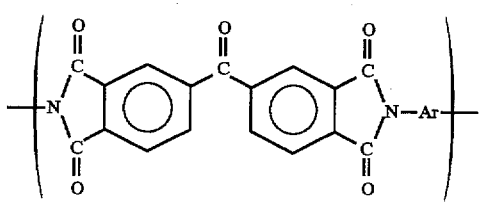

(1)

wherein Ar is a group represented by the following formula (2) or (3), the group of the formula (2) being contained in an amount of 10–98% by mole and the group of the formula (3) being contained in an amount of 90–5% by mole;

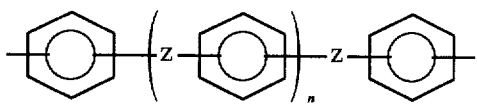

(2)

wherein Z represents —C(=O)—, —SO$_2$—, —O—, —S—, —(CH$_2$)$_m$—, —NH—C(=O)—, —C(CH$_3$)$_2$—, —C(CF$_3$)$_2$—, —C(=O)—O— or a bond; n and m are each an integer of 1 or greater; Z's may be the same or different from each other, and each hydrogen in each benzene ring may be substituted with an appropriate substituent;

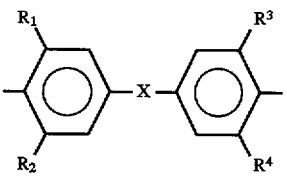

(3)

wherein R$_1$, R$_2$, R$_3$ and R$_4$ represent independently hydrogen, C$_{1-4}$ alkyl group or alkoxy group, with at least two of them being alkyl group or alkoxy group; and X represents —CH$_2$—, —C(CH$_3$)$_2$—, —O—, —SO$_2$—, —C(=O)— or —NH—C(=O)—.

For producing a multilayer printed wiring board such as described above, as shown in FIG. 1, a plurality of B-staged interlaminar insulating layers 1 and insulating substrates 21 are selected so that the difference in glass transition point between the adjoining insulating layers will fall in the range not exceeding 60° C., and said interlaminar insulating layers and insulating circuit boards 2 having circuits 22 formed on the insulating substrates are integrally laminated by heating under pressure, and then via holes for making electrical connection between two or more layers of circuits are formed. Said via holes run through two layers of said insulating substrates and the interlaminar insulating layer disposed therebetween. Said interlaminar insulating layers are the insulating layers containing no reinforcement such as woven or nonwoven glass fabrics. Also, the B-stage resin flow of said insulating layers is less than 1%, and the difference in glass transition point between an insulating layer and the insulating substrate adjacent thereto is not greater than 60° C.

Such a multilayer printed wiring board can also be produced according to the following processes (a)–(d).

Process (a)

Figure 12A:
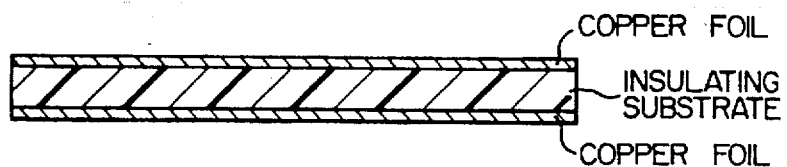
FIGS. 12A to 12G are diagrammatic sectional views for illustrating an example of production process according to the present invention.
Figure 12B:
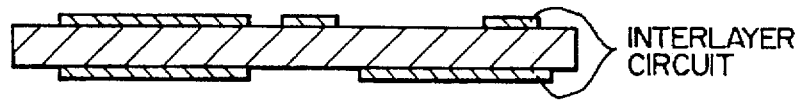
Figure 12C:
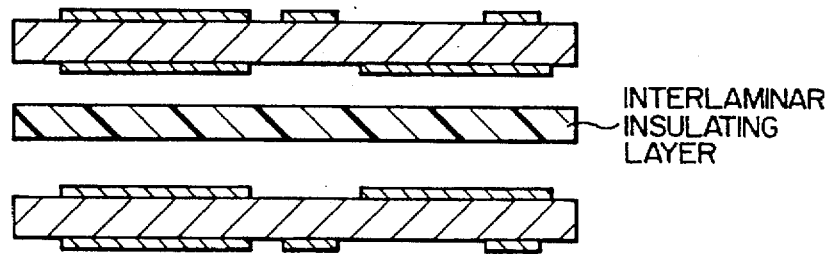
Figure 12D:
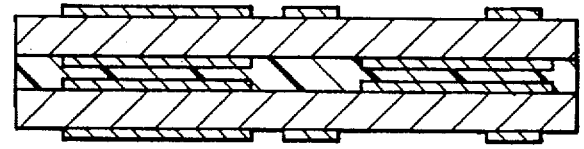
Figure 12E:
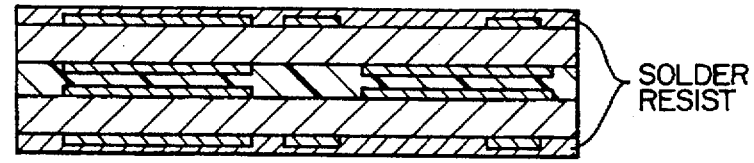
Figure 12F:
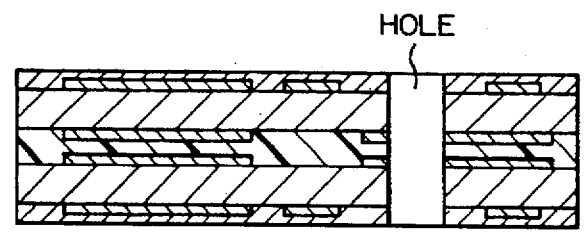
Figure 12G:
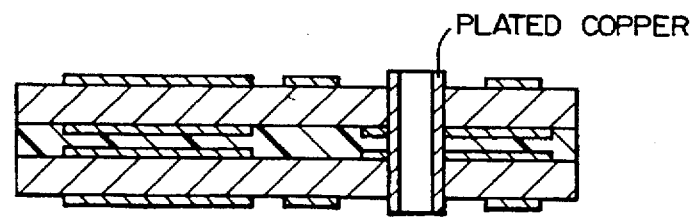

First, etching resists are provided at the parts where circuits are to be formed on a laminate comprising copper-clad insulating substrates containing reinforcing fiber, such as shown in FIG. 12A, to constitute an insulating circuit board as shown in FIG. 12B. There are prepared at least two insulating circuit boards described above. Between these insulating circuit boards is disposed an interlaminar insulating layer which is in the state of B stage and contains no reinforcing fiber and in which the B-stage resin flow is less than 1% and the difference in glass transition point between this layer and the adjoining insulating substrate is not greater than 60° C. (FIG. 12C). These insulating circuit boards and insulating layers are laminated by heating under pressure as shown in FIG. 12D, and solder resists are provided over the whole surfaces of the integral multilayer laminate as shown in FIG. 12E. Then holes are formed by a drill to the section where electrical connection is required, as shown in FIG. 12F, and a conductor layer is formed on the inside of each of said holes by electroless plating, thereby producing a multilayer wiring board as shown in FIG. 12G. Formation of holes down to the necessary section for connection can be accomplished by driving a revolving drill down to the depth of the layer to be connected, stopping further driving of the drill at this point and returning it to the initial position.

Process (b)

Figure 13A:
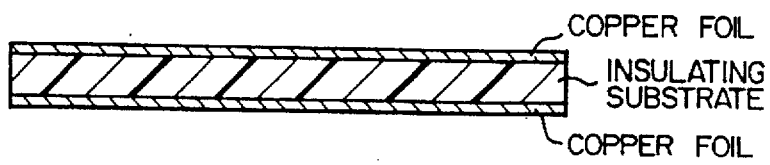
FIGS. 13A to 13G are diagrammatic sectional views for illustrating another example of production process according to the present invention.
Figure 13B:
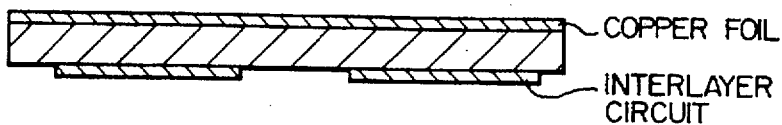
Figure 13C:
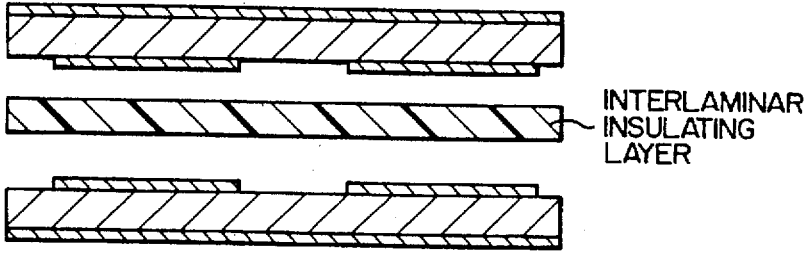
Figure 13D:
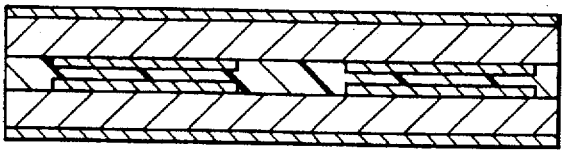
Figure 13E:
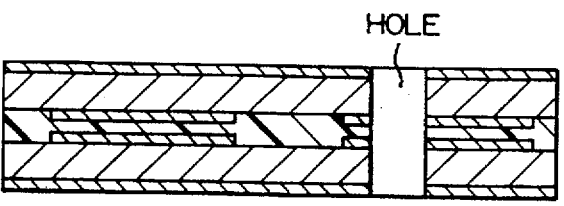
Figure 13F:
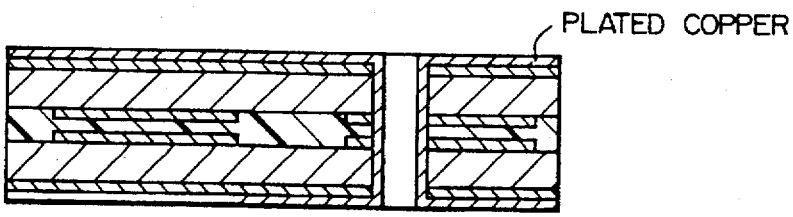
Figure 13G:
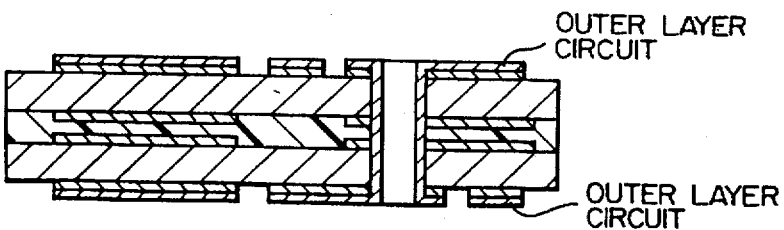

No circuit working is performed on the outermost side of the insulating circuit board constituting the outermost layer of the laminate consisting of copper-clad insulating substrates containing reinforcing fiber such as shown in FIG. 13A, and etching resists are formed at the parts which are to become circuits. The unnecessary copper foil is etched away to make an insulating board shown in FIG. 13B. There are prepared at least two such circuit boards. At least between these circuit boards is disposed an interlaminar insulating layer which is in the state of B stage and further characterized by the facts that the B-stage resin flow is less than 1%, with the difference in glass transition point between the adjoining insulating layers being not greater than 60° C. (FIG. 13C), and that said circuit boards and insulating layers are laminated by heating under pressure as shown in FIG. 13D. Holes are formed in the obtained laminate to a depth necessary for connection as shown in FIG. 13E. A conductor layer is formed by electroless plating as shown in FIG. 13F. Then etching resists are formed on the outermost copper-clad surfaces, and the unnecessary copper is etched away as shown in FIG. 13G.

Process (c)

Etching resists are formed at the pertinent parts (for forming circuits) of a laminate consisting of copper-clad insulating substrates containing reinforcing fiber, and the unnecessary copper foil is etched away to form an insulating circuit board. There are prepared a pair of such insulating circuit boards. Between these insulating circuit boards is sandwiched an interlaminar insulating layer which is B-staged and specified by the facts that its B-stage resin flow is less than 1%, that the difference in glass transition point between the adjoining insulating layers is not greater than 60° C., and that this layer contains no reinforcing fiber. These circuit boards and insulating layers are laminated by heating under pressure, holes are formed in the laminate, and conductor layers are formed by electroless plating to make an interlayer circuit board. There are prepared at least two such interlayer circuit boards, and between these interlayer circuit boards is disposed an interlaminar insulating layer which is B-staged, has a B-stage resin flow of less than 1%, with the difference in glass transition point between the adjoining insulating layers being not greater than 60° C., and contains no reinforcing fiber. These circuit boards and insulating layers are laminated by heating under pressure, plated resists are formed over the surfaces of the laminate, holes are formed in the laminate by drilling, and conductor layers are further formed by electroless plating.

Process (d)

Figure 14A:
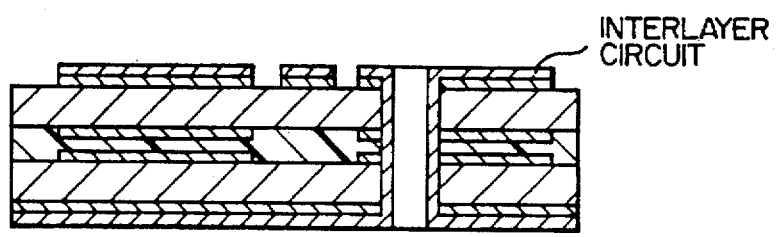
FIGS. 14A to 14D are diagrammatic sectional views for illustrating still another example of production process according to the present invention.
Figure 14B:
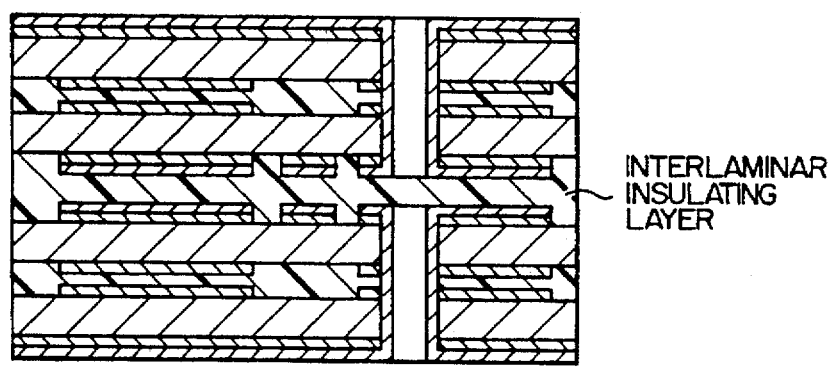
Figure 14C:
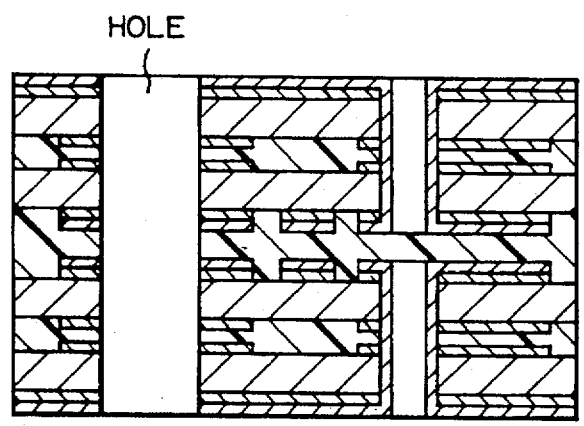
Figure 14D:
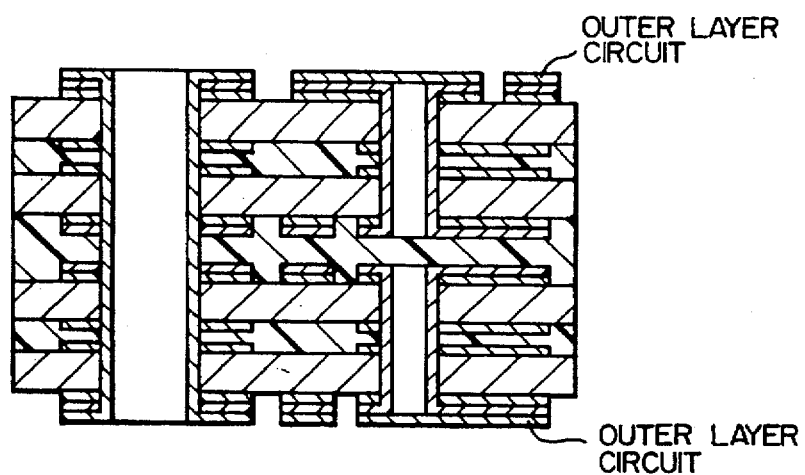

Two interlaminar circuit boards such as shown in FIG. 14A are made according to the process (c) described above. Between these circuit boards is disposed an interlaminar insulating layer which is B-staged, has a B-stage resin flow of less than 1%, with the difference in glass transition point between the adjoining insulating layers being not greater than 60° C., and contains no reinforcing fiber, as shown in FIG. 14B. They are integrally laminated by heating under pressure, and as shown in FIG. 14C, holes are formed by drilling in the laminate to a depth reaching the section where electrical connection is required. Then, as shown in FIG. 14D, conductor layers are formed by electroless plating, etching resists are formed to the shape of the circuits in the outermost layer, and unnecessary copper foil is etched away.

Figure 2A:
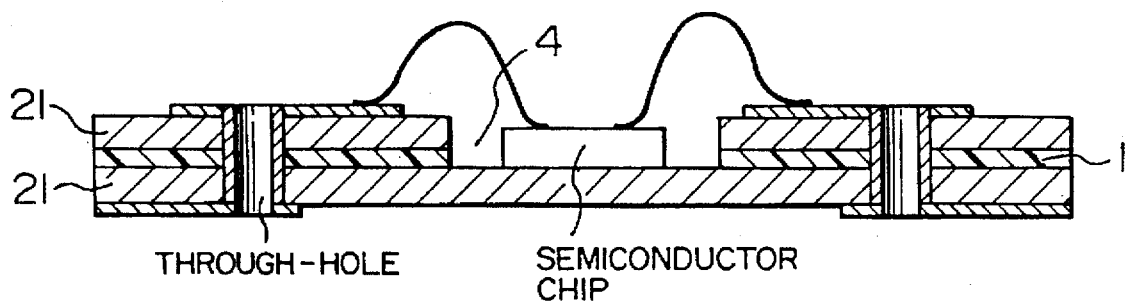
FIGS. 2A to 2C are diagrammatic sectional views for illustrating an example of use of the present invention.

In at least one of the interlaminar insulating layers 1 or insulating substrates 21 in said multilayer wiring board are formed cavities 4 for housing the semiconductor chips to be mounted later, as shown in FIG. 2A, to provide a multilayer wiring board for chip carrier.

Conventional methods can be used for forming said cavities.

Figure 2B:
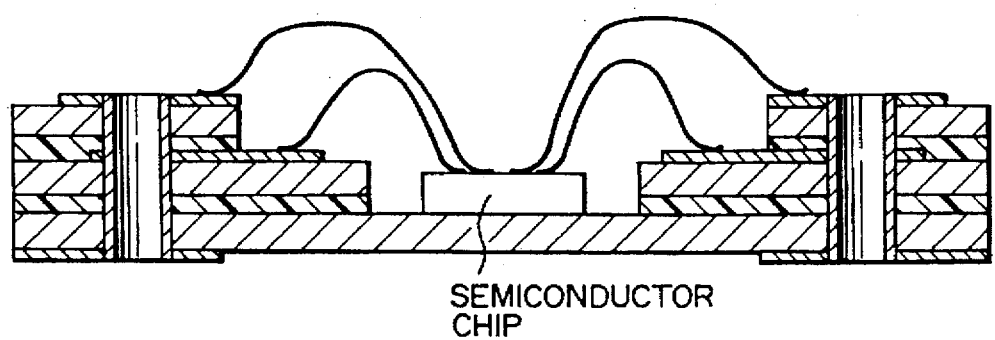

Preferably, the cavities are enlarged in size successively from the one in the insulating layer closest to the location where a semiconductor chip is to be set as shown in FIG. 2B, and terminals for making electrical connection with the semiconductor chips to be mounted later are provided in the circuits formed on the surfaces of the interlaminar insulating layers or semiconductor substrates exposed by the respective cavities, thereby providing a chip carrier with many electrical connections.

Figure 2C:
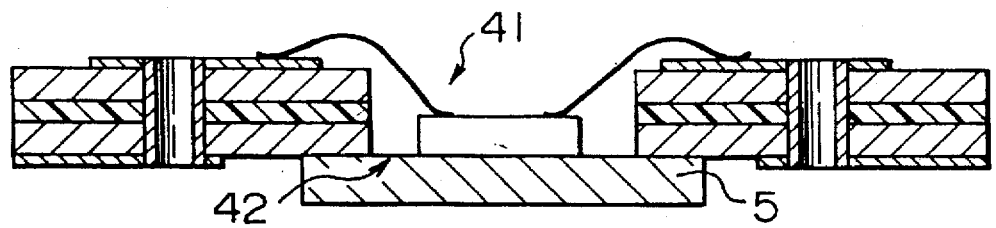

A chip carrier with high heat radiating efficiency can be obtained by providing a heat sink 5 arranged to close one of the openings 42 of the cavity formed as a through-hole as shown in FIG. 2C.

Figure 3:
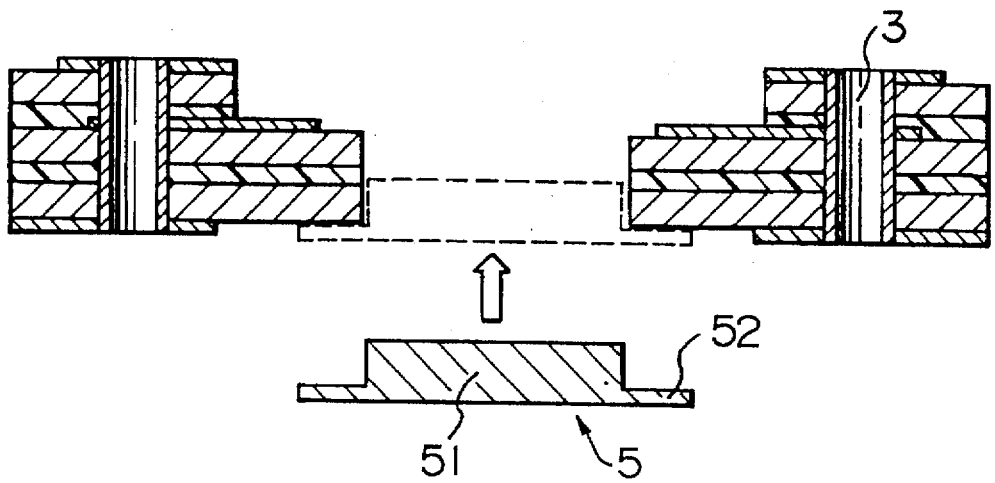
FIG. 3 is a diagrammatic sectional view showing a mode of practice of the present invention.

This heat sink 5 may be designed to consist of a support portion 51 for carrying a semiconductor chip and a brim 52 provided around said support portion and smaller in thickness than the support portion as shown in FIG. 3. The support portion of the heat sink is fitted in an opening formed in the outermost one of the interlaminar insulating layers or insulating substrates, said opening being substantially same in size as said support portion of the heat sink. The insulating substrates having circuits formed thereon are placed on said heat sink and integrally laminated by heating under pressure, and then via holes for making electrical connection between two or more layers of circuits are formed. It is thereby possible to accomplish attachment of the heat sink and laminate molding of the chip carrier at the same time.

Adhesive strength of the heat sink can be increased by forming a pertinent unevenness on the surface of at least the brim portion 52 of the heat sink to be attached to an insulating layer.

Figure 4A:
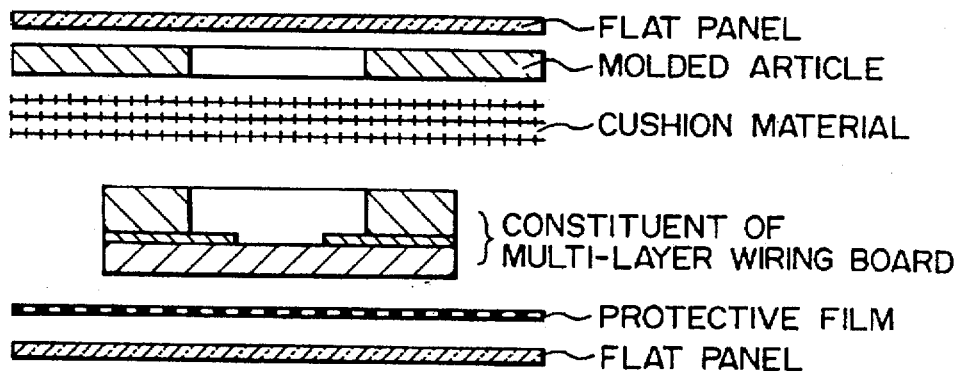
FIGS. 4A and 4B are diagrammatic sectional views for illustrating the process of the present invention.
Figure 4B:
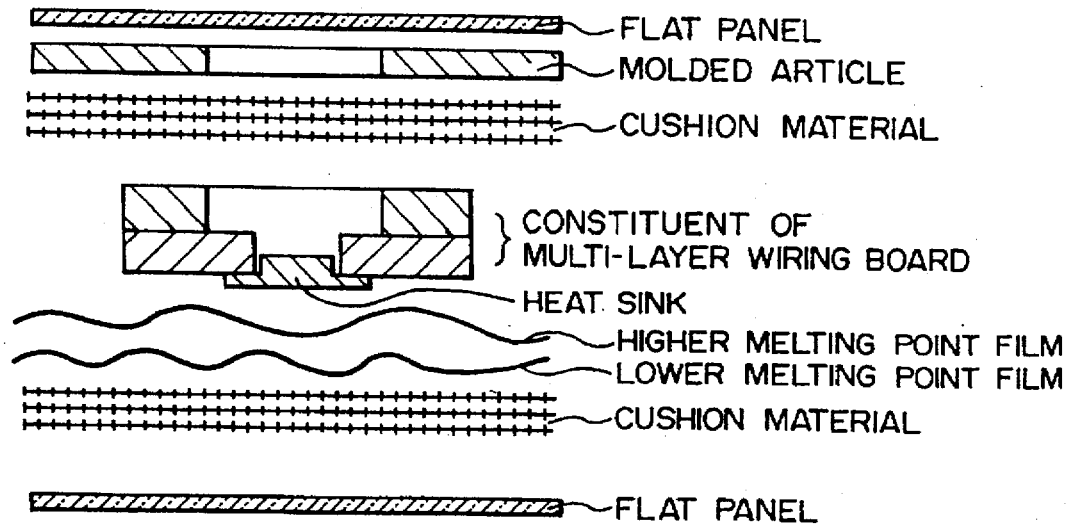

For laminate molding of the chip carrier, holes designed to serve as cavities for housing the semiconductor chips to be mounted later are formed in at least one of the interlaminar insulating layers or insulating substrates, and the laminating members are placed one on the other successively in the order of flat panel/protective film/combination of B-staged interlaminar insulating layers and insulating substrates having circuits/cushion material/molded article having holes of the same size as cavities/flat panel, and they are integrally laminated by heating under pressure, as shown in FIG. 4A.

For attaching the heat sink simultaneously with laminate molding of the chip carrier, the laminating members are placed in the order of flat panel/cushion material/plastic film low in melting point and high in flow at heating temperature for lamination (e.g. polyethylene film)/protective film high in melting point and flexible at heating temperature for lamination/combination of B-staged interlaminar insulating layers and insulating substrates having circuits/cushion material/molded article having holes of the same size as cavities/flat panel.

In this chip carrier, terminals for making electrical connection with other wiring boards are provided on one side, and openings for mounting semiconductor chips may be provided on the same side or on the opposite side.

Figure 5A:
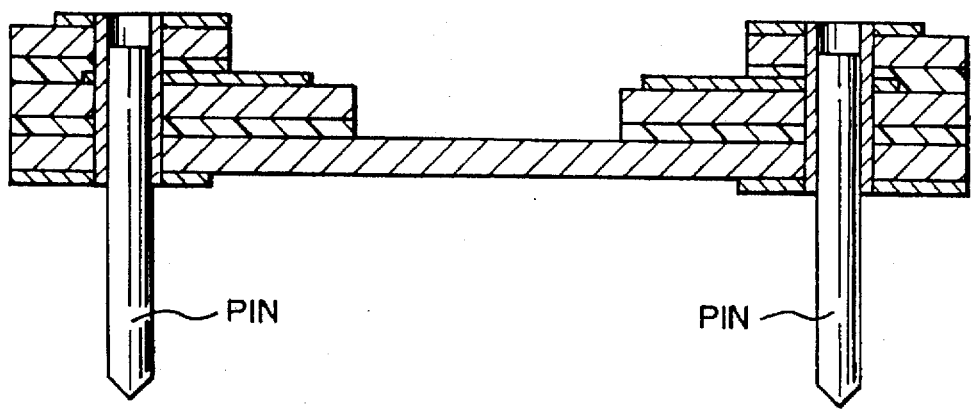
FIGS. 5A to 5C are diagrammatic sectional views showing another mode of practice of the present invention.
Figure 5B:
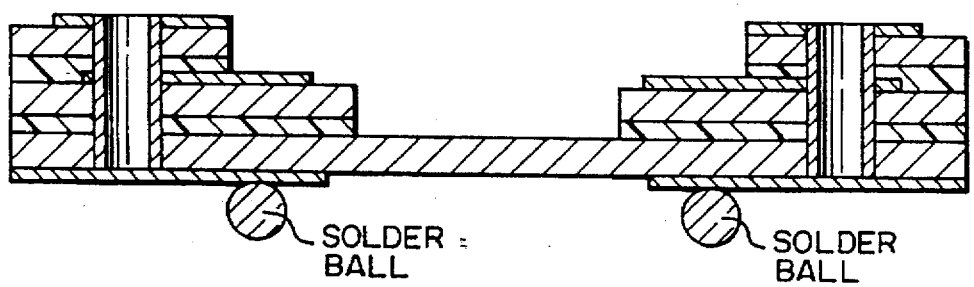

When a plurality of pins are used as terminals for making electrical connection with other wiring boards as shown in FIG. 5A, a pin grid array package is provided. When lands are formed for electrical connection by use of solder balls as terminals for making electrical connection with other wiring boards as shown in FIG. 5B, a ball grip array is provided.

Figure 5C:
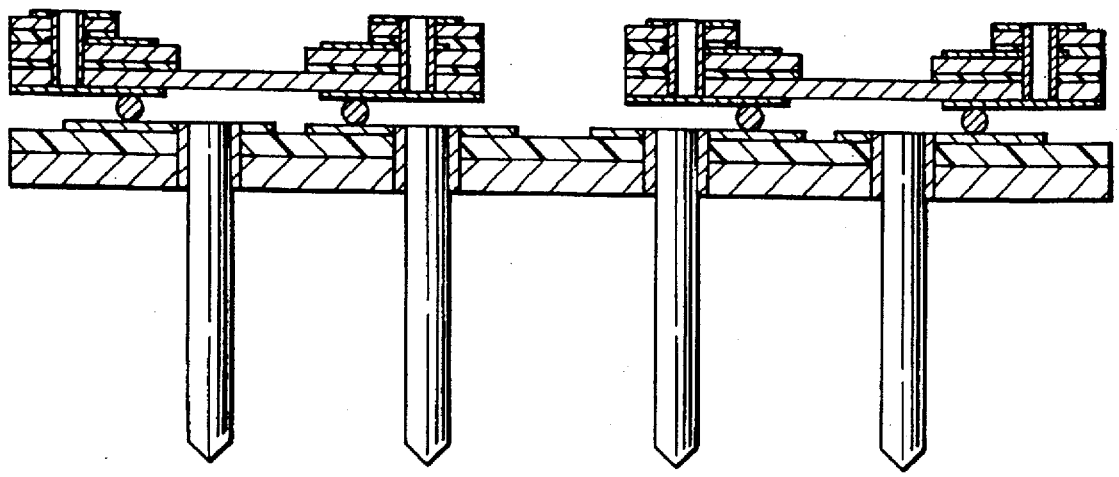

It is also possible to form a chip-on-chip wiring board or a multi-chip module by combining said arrays as shown in FIG. 5C.

The present inventors found that when the interlaminar insulating layers contain no reinforcement such as woven or nonwoven glass fabrics, there tends to take place exfoliation of laminations or formation of voids therein due to heat history between the adjoining insulating substrates, and this phenomenon becomes more likely to occur when through-holes are formed piercing the multilayer wiring board or many via holes are formed in the layers containing no reinforcement such as woven or nonwoven glass fabrics. Regarding the induction mechanism of this phenomenon, the present inventors have obtained the following knowledges.

If the difference in glass transition point between said interlaminar insulating layer and the adjoining insulating substrate exceeds 60° C., when the laminate is cooled after heat curing, the material with high glass transition point is perfectly solidified but the material with low glass transition point does not lose its fluidity and is forced to contract with reduction of temperature. Consequently a large stress is built up in the laminate, which may cause break of the interlaminar insulating layers at the parts where the through-holes or via holes are present in close order.

More specifically, the multilayer wiring board of the above structure is subject to the following undesirable phenomena as illustrated in FIG. 11.

Figure 11A:
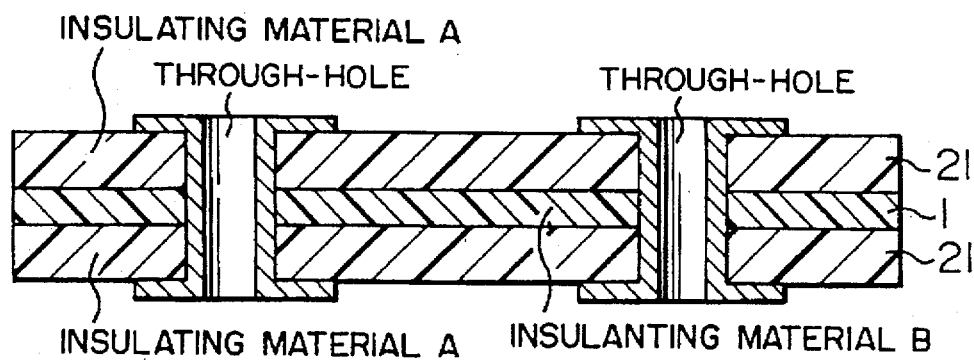
FIGS. 11A to 11D are diagrammatic sectional views for illustrating the prior art problems.

(1) Movement of the substrate in the thickness direction is restricted by through-holes or via holes (FIG. 11A).

Figure 11B:
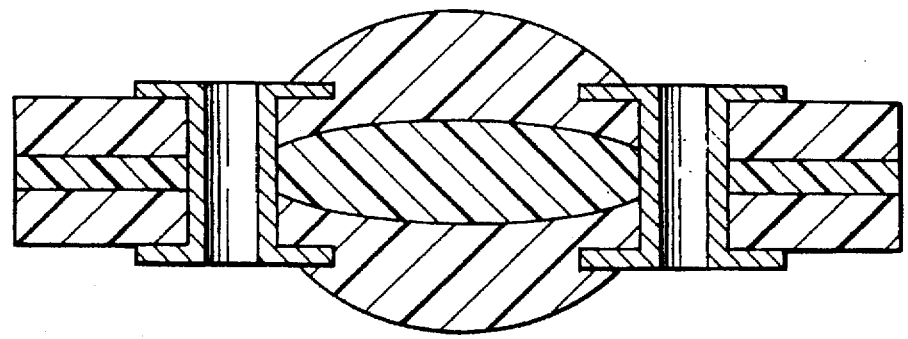

(2) Due to this restriction, when the laminate is heated, the whole insulating layer swells up to the form of a drum delimitated by through-holes or via holes (FIG. 11B).

Figure 11C:
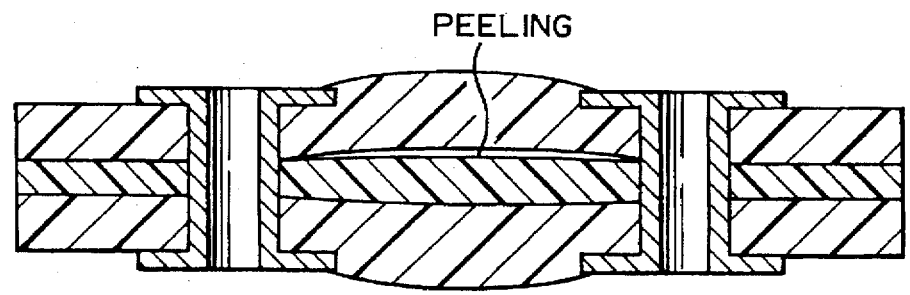

(3) When cooled, this drum-like form shrinks down only to the shape allowed to hold at the glass transition temperature of the material with high glass transition point (FIG. 11C).

(4) The material with low glass transition point is still on the go to restore its original shape even when the temperature lowers below the glass transition point of the material with high glass transition point, but since the material with high glass transition point is already solidified, a large stress builds up between said two different types of material.

Figure 11D:
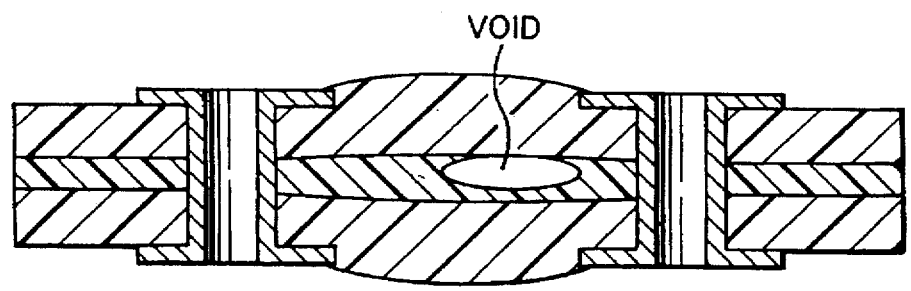

(5) Exfoliation and formation of voids are caused by the large stress (FIG. 11D).

The present invention has been attained on the basis of the above disclosure and especially features the finding that when the difference between glass transition point of the interlaminar insulating layer and that of the adjoining insulating substrate is not greater than 60° C., there is produced no large stress that will cause exfoliation of laminations or formation of voids. The smaller the difference, the more desirable. Said difference is more preferably not greater than 40° C.

In the case of a multilayer wiring board made by using a plurality of interlaminar insulating layers and insulating substrates, it is desirable that not only the difference of glass transition point between the adjoining insulating layers but also the difference of glass transition point between the insulating layers used in each unit of wiring board be small, preferably not greater than 60° C., more preferably not greater than 40° C.

By setting the B-stage resin flow of the interlaminar insulating layers not containing reinforcement such as woven or nonwoven glass fabrics to be less than 1%, it is possible to secure the required layer thickness. Also, when these insulating layers are used for a chip carrier having cavities, it is possible to minimize penetration of resin into the cavities. Further, by setting the viscoelasticity of said insulating layers at 30° C. to be in the range of 2,000–5,000 MPa, it is possible to enhance handling qualities of the layers in the working process, and by setting said viscoelasticity at the molding temperature to be in the range below 10 MPa, it is possible to secure enough laminate moldability for embedding the circuit conductors in said layers.

EXAMPLE 1

This Example is explained with reference to FIGS. 6–8 of the accompanying drawings.

Figure 6A:
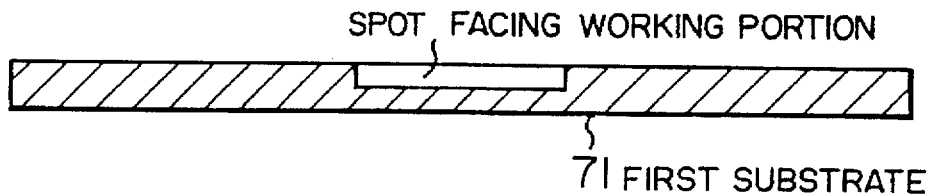
FIGS. 6A to 6G are diagrammatic fragmentary sectional views for illustrating the structure of the present invention.
Figure 7:
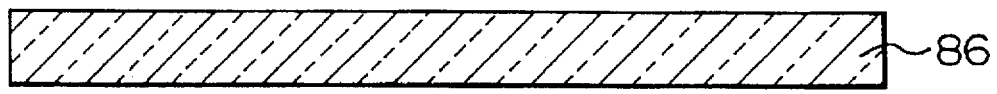
FIG. 7 is a diagrammatic sectional view for illustrating the process in an embodiment of the present invention.
Figure 7:
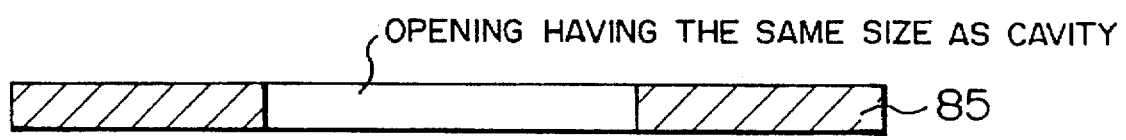
Figure 7:
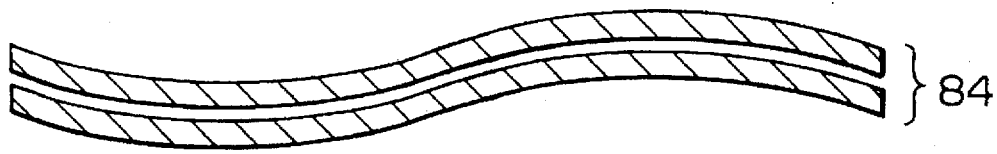
Figure 7:
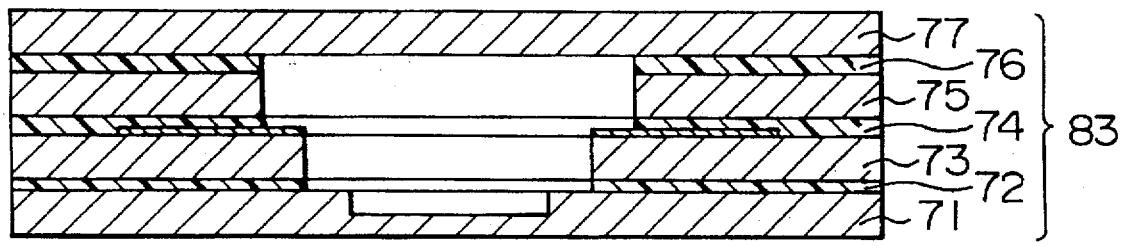
Figure 7:
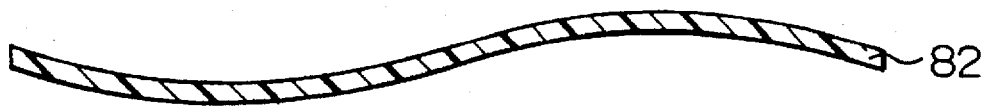
Figure 7:
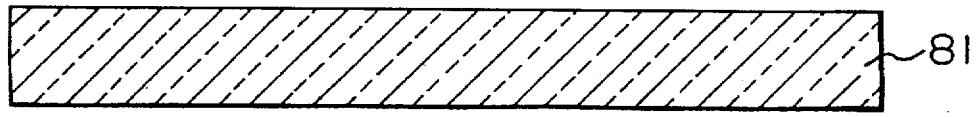

(1) The side with no copper foil of a BT resin-type single-side copper-clad laminate CCH-HL 830 (trade name, available from Mitsubishi Gas Chemical Co., Ltd.) having a glass transition point of about 170° C. and a thickness of 0.4 mm was subjected to spot facing to a depth of 0.2 mm to prepare a first insulating substrate 71 having a hollow such as shown in FIG. 6A.

Figure 6B:
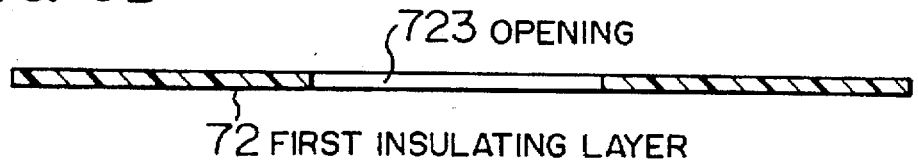

(2) In a polyimide adhesive film AS-2250 (trade name, available from Hitachi Chemical Co., Ltd.) having a glass transition point of about 170° C. and a thickness of 0.05 mm, there was provided an opening 723 greater than the spot facing working portion of the first insulating substrate to prepare first interlaminar insulating layer 72 such as shown in FIG. 6B.

Figure 6C:
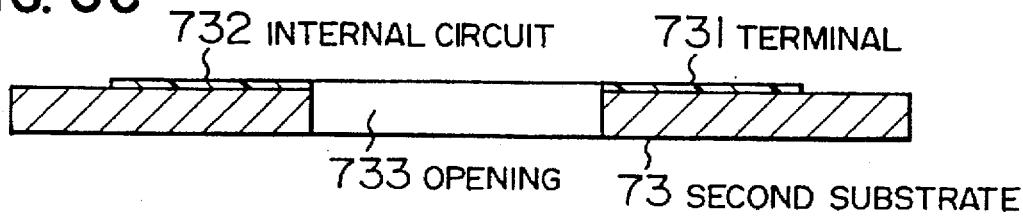

(3) In a BT resin-type single-side copper-clad laminate CCH-HL 830 (trade name, available from Mitsubishi Gas Chemical Co., Ltd.) was provided an opening 733 the same in size as the opening of the first interlaminar insulating layer, and terminal 731 for making electrical connection with semiconductor chip by wire bonding was provided at the part to be exposed when a third insulating substrate is laminated at a later stage, while inner layer circuit 732 was provided at the non-exposed part to prepare a second insulating substrate 73 such as shown FIG. 6C.

Figure 6D:
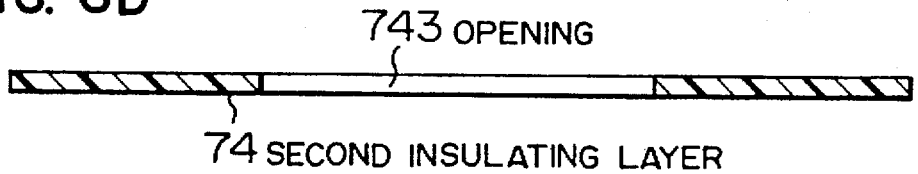

(4) In a 0.075 mm thick polyimide adhesive film AS-2250 (mentioned above) was provided an opening 743 the same in size as the opening of the second insulating substrate to prepare a second interlaminar insulating layer 74 such as shown in FIG. 6D.

Figure 6E:
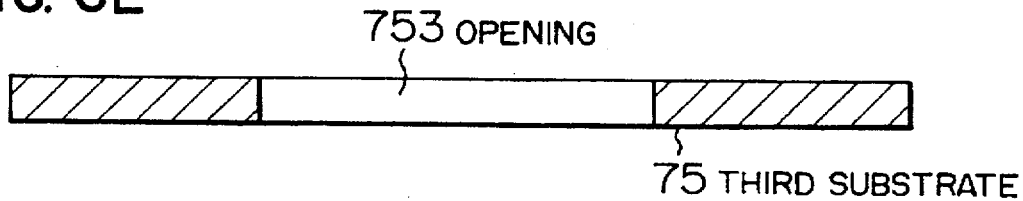

(5) In a 0.4 mm thick BT resin-type single-side copper-clad laminate CCH-HL 830 (mentioned above) was provided an opening 753 greater than the opening in the third insulating substrate to prepare a third insulating substrate 75 such as shown in FIG. 6E.

Figure 6F:
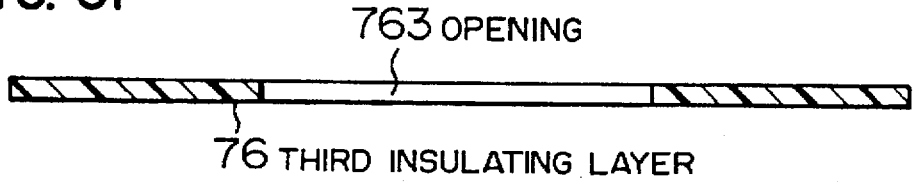

(6) In a 0.1 mm thick polyimide adhesive film AS-2250 (mentioned above) was provided an opening 763 of the same size as the opening in the third insulating substrate to prepare a third interlaminar insulating layer 76 such as shown in FIG. 6F.

Figure 6G:
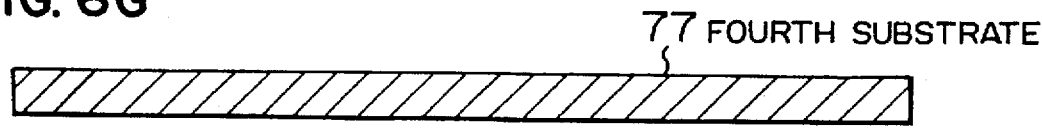

(7) A 0.2 mm thick BT resin-type single-side copper-clad laminate CCH-HL 830 (mentioned above) was used as a fourth insulating substrate 77 as shown in FIG. 6G.

(8) The layers obtained in (1)–(7) above were placed one over the other in that order and integrally laminated under the conditions of 20 kgf/cm², 180° C. and 180 minutes. The laminate had the structure of: flat panel 81/protective film 82/structure 83 of (1)–(7)/cushion 84/molded article 85 with opening of the same size as cavity/flat panel 86, as shown in FIG. 7.

Figure 8A:
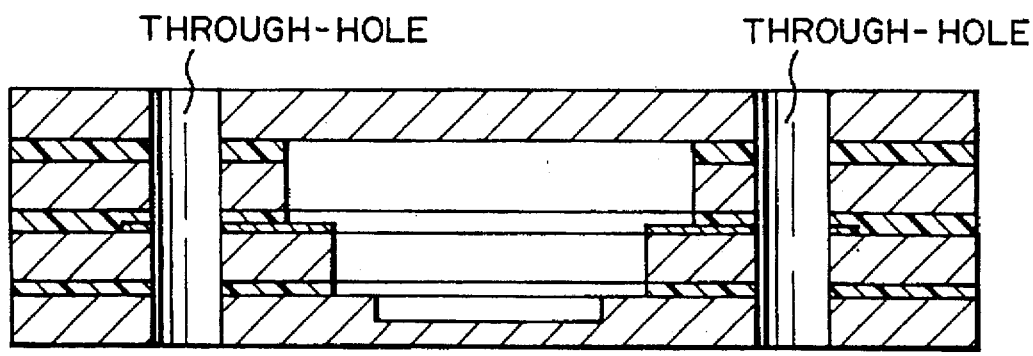
FIGS. 8A to 8E are diagrammatic sectional views for illustrating the respective steps in the process according to an embodiment of the present invention.
Figure 8B:
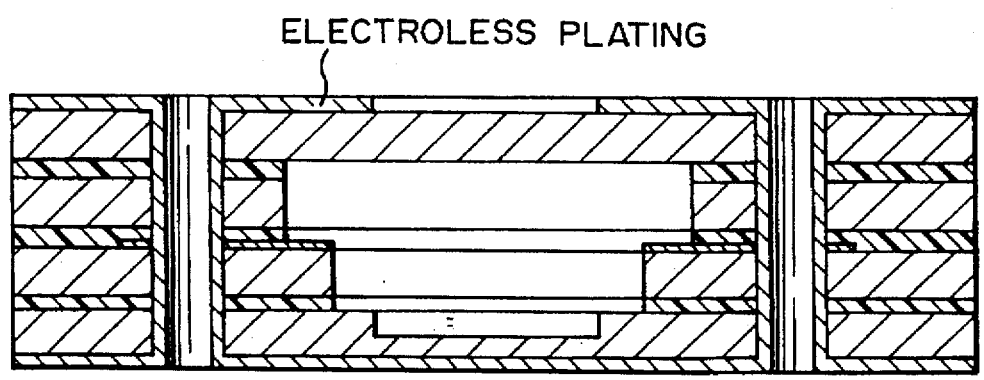
Figure 8C:
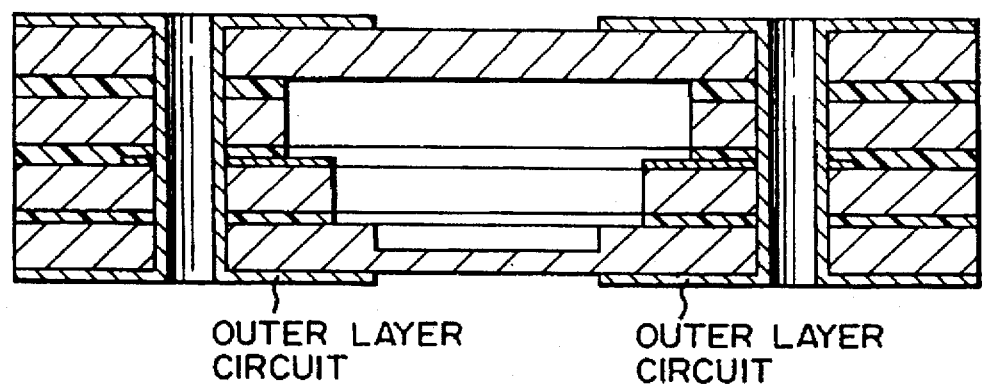
Figure 8D:
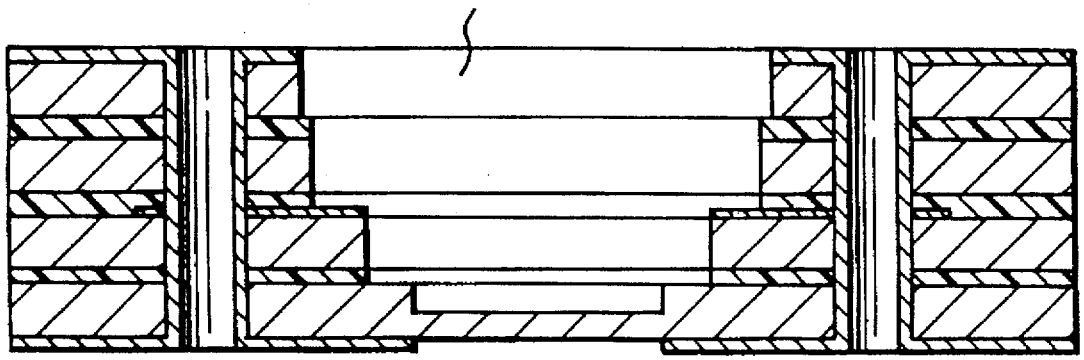
Figure 8E:
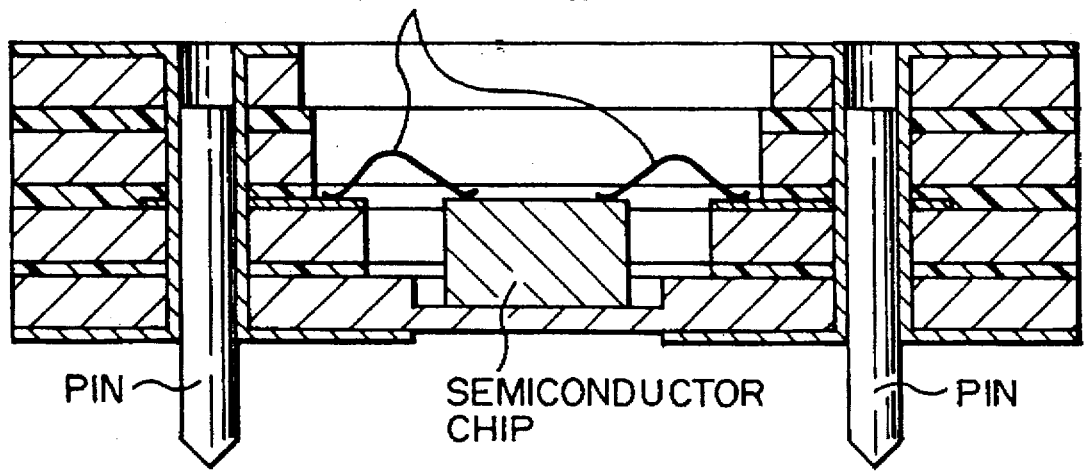

(9) After laminate molding, through-holes were formed (FIG. 8A), and electroless plating was carried out on the inner walls of said through-holes and the surface of the laminate (FIG. 8B), and then outer layer circuits were formed (FIG. 8C). For forming cavity, an opening of the same size as the opening in the third insulating substrate was formed at the same location, and then an opening was further formed by end milling machine at the part corresponding to the fourth insulating substrate (FIG. 8D). Finally, a plurality of pins were fixed in the through-holes to constitute a pin grid array with cavities.

EXAMPLE 2

(1) An epoxy resin-impregnated copper-clad glass cloth laminate MCL-E-67 (trade name, available from Hitachi Chemical Co., Ltd.) having a glass transition point of about 120° C. and a thickness of 0.2 mm was prepared as first insulating substrate.

(2) A polymeric epoxy adhesive film AS-3000 (mentioned above) having a glass transition point of about 120° C. and a thickness of 0.05 mm and provided with an opening to define a cavity was prepared as first interlaminar insulating layer.

(3) In a 0.4 mm thick epoxy resin-impregnated copper-clad glass cloth laminate MCL-E-67 (mentioned above) was provided an opening of the same size as the opening in the first interlaminar insulating layer, and a terminal for connection with semiconductor chip by wire bonding was provided at the part which is exposed when laminated with a third insulating substrate, while inner layer circuits were provided at the non-exposed part to prepare a second insulating substrate.

(4) In a 0.05 mm thick polymeric epoxy adhesive film AS-3000 (mentioned above) was provided an opening greater than the opening in the second insulating substrate to prepare a second interlaminar insulating layer.

(5) In a 0.4 mm thick epoxy resin-impregnated copper-clad glass cloth laminate MCL-E-67 (mentioned above) was provided an opening of the same size as the second interlaminar insulating layer, and a terminal for connection with semiconductor chip by wire bonding was provided at the part which is exposed when laminated with a fourth insulating substrate, while inner layer circuits were provided at the non-exposed part to prepare a third insulating substrate.

(6) In a 0.05 mm thick polymeric epoxy adhesive film AS-3000 was provided an opening greater than the opening in the third substrate to prepare a third interlaminar insulating layer.

(7) In a 0.4 mm thick epoxy resin-impregnated copper-clad glass cloth laminate MCL-E-67 was provided an opening of the same size as the third interlaminar insulating layer to prepare a fourth insulating substrate.

(8) In a 0.05 mm thick polymeric epoxy adhesive film AS-3000 was provided an opening of the same size as the opening in the fourth insulating substrate to prepare a fourth interlaminar insulating layer.

(9) A 0.4 mm thick epoxy resin-impregnated copper-clad glass cloth laminate MCL-E-67 was prepared as a fifth insulating substrate.

(10) The layers obtained in (1)–(9) above were placed one over the other in that order and integrally laminated by heating under pressure under the conditions of 40 kgf/cm², 175° C. and 90 minutes. The laminate, as shown in FIG. 7, had the structure of: flat panel 81/protective film 82/structure 83 of (1)–(9)/cushion 84/molded article 85 having opening defining cavity/flat panel 86.

Figure 9A:
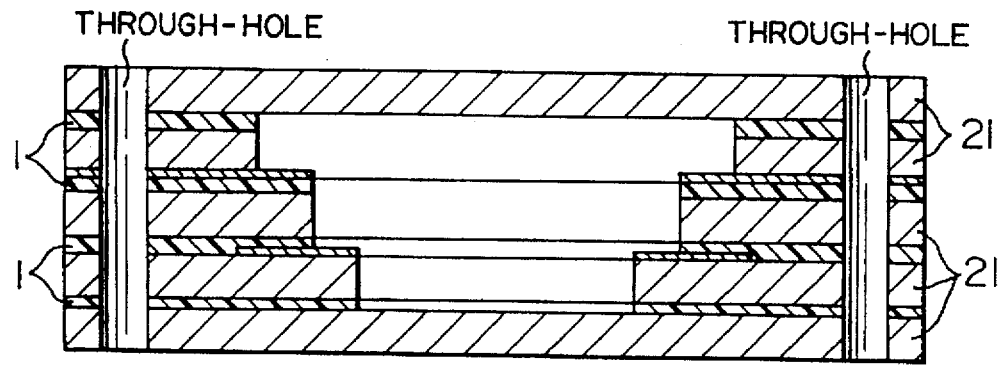
FIGS. 9A to 9D are diagrammatic sectional views for illustrating the respective steps in the process according to another embodiment of the present invention.
Figure 9B:
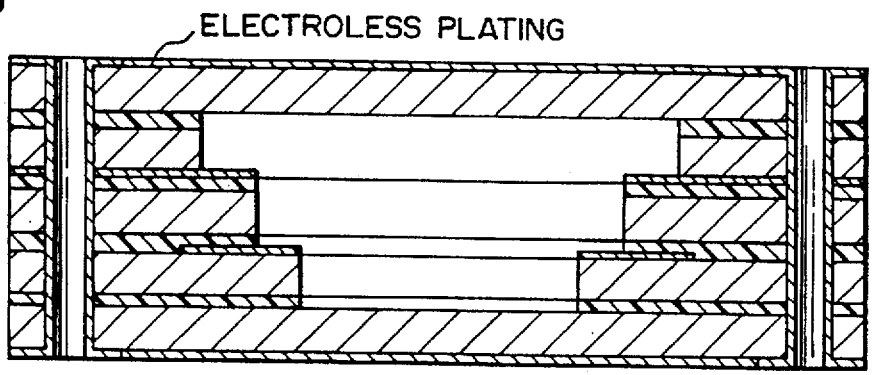
Figure 9C:
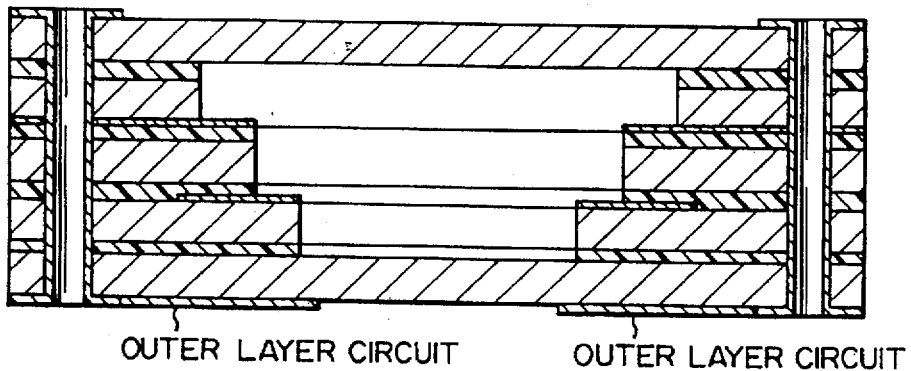
Figure 9D:
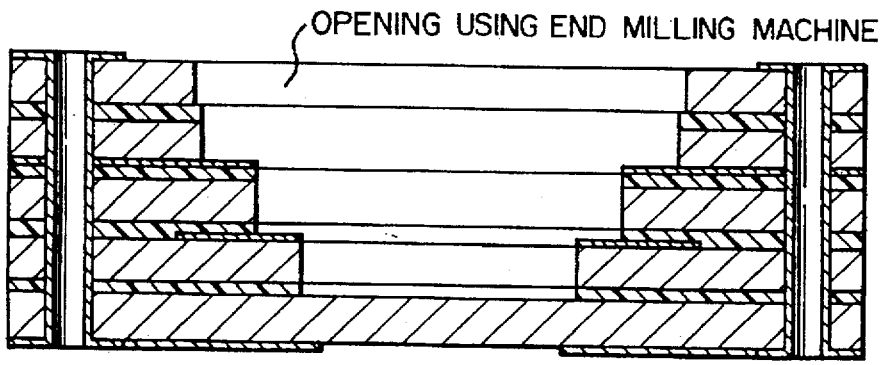

(11) After laminate molding, through-holes were formed (FIG. 9A), the inner walls thereof and the surfaces of the laminate were subjected to electroless plating (FIG. 9B), outer layer circuits including lands for fusion-bonding solder balls were worked (FIG. 9C), an opening of the same size as the opening in the fourth insulating substrate was formed at the same part while an opening was formed by end milling machine at the part corresponding to the fifth insulating substrate for forming cavity (FIG. 9D), and then solder resists were applied and dried to constitute a ball grid array.

EXAMPLE 3

In Example 1, through-hole was provided instead of spot facing working portion in the first substrate, and a heat sink having a brim such as shown in FIG. 3 was prepared. The layers were laminated under the same conditions as in Example 1 except for the laminate structure of: flat panel/ cushion/polyethylene film/polyimide film/structure of (1)– (7)+heat sink/cushion/molded article with opening defining cavity/flat panel to constitute a pin grid array.

EXAMPLE 4

(1) An epoxy resin-impregnated copper-clad glass cloth laminate MCL-E-67 (mentioned above) having a glass transition point of about 120° C. and a thickness of 0.2 mm was prepared as a first insulating substrate.

(2) In a polymeric epoxy adhesive film AS-3000 (mentioned above) having a glass transition point of about 120° C. and a thickness of 0.05 mm was provided an opening defining cavity to prepare a first interlaminar insulating layer.

(3) Two pieces of 0.1 mm thick epoxy resin-impregnated copper-clad glass cloth laminate MCL-E-67 (mentioned above), each being provided with inner layer circuits and having via holes formed therein, were laminated by disposing therebetween an epoxy resin prepreg GEA-679 (mentioned above) having a glass transition point of about 120° C. and a thickness of 0.1 mm. An opening having the same size as the opening in the first interlaminar insulating layer was formed in the laminate. A terminal for connection with semiconductor chip by wire bonding was provided at the part which is exposed when laminated with a third insulating substrate, and inner layer circuits were provided at the non-exposed part to prepare a second insulating substrate.

(4) In a 0.05 mm thick polymeric epoxy adhesive film AS-3000 was formed an opening greater than the opening in the second insulating substrate to prepare a second interlaminar insulating layer.

(5) Epoxy solder resists having a glass transition point of about 110° C. were applied to two pieces of 0.1 mm thick epoxy resin-impregnated copper-clad glass cloth laminate MCL-E-67, each being provided with inner layer circuits and having via holes formed therein, and they were laminated. An opening of the same size as the second interlaminar insulating layer was formed in the laminate. A terminal for connection to semiconductor chip by wire bonding was provided at the part exposed when laminated with a fourth insulating substrate, and inner layer circuits were provided at the non-exposed part to prepare a third insulating substrate.

(6) In a 0.05 mm thick polymeric epoxy adhesive film AS-3000 was formed an opening greater than the opening in the third insulating substrate to prepare a third interlaminar insulating layer.

(7) In a 0.4 mm thick epoxy resin-impregnated copper-clad glass cloth laminate MCL-E-67 was formed an opening of the same size as the third interlaminar insulating layer to prepare a fourth insulating substrate.

(8) In a 0.05 mm thick polymeric epoxy adhesive film AS-3000 was formed an opening of the same size as the opening in the fourth insulating substrate to prepare a fourth interlaminar insulating layer.

(9) A 0.4 mm thick epoxy resin-impregnated copper-clad glass cloth laminate MCL-E-67 was prepared as a fifth insulating substrate.

(10) The layers obtained in (1)–(9) above were placed one over the other in that order and laminated under the conditions of 40 kgf/cm² 175° C. and 90 minutes. The laminate had the structure of: flat panel 81/protective film 82/structure of (1)–(9) 83/cushion 84/molded article 85 having opening of the same size as cavity/flat panel 86, as shown in FIG. 7.

Figure 10:
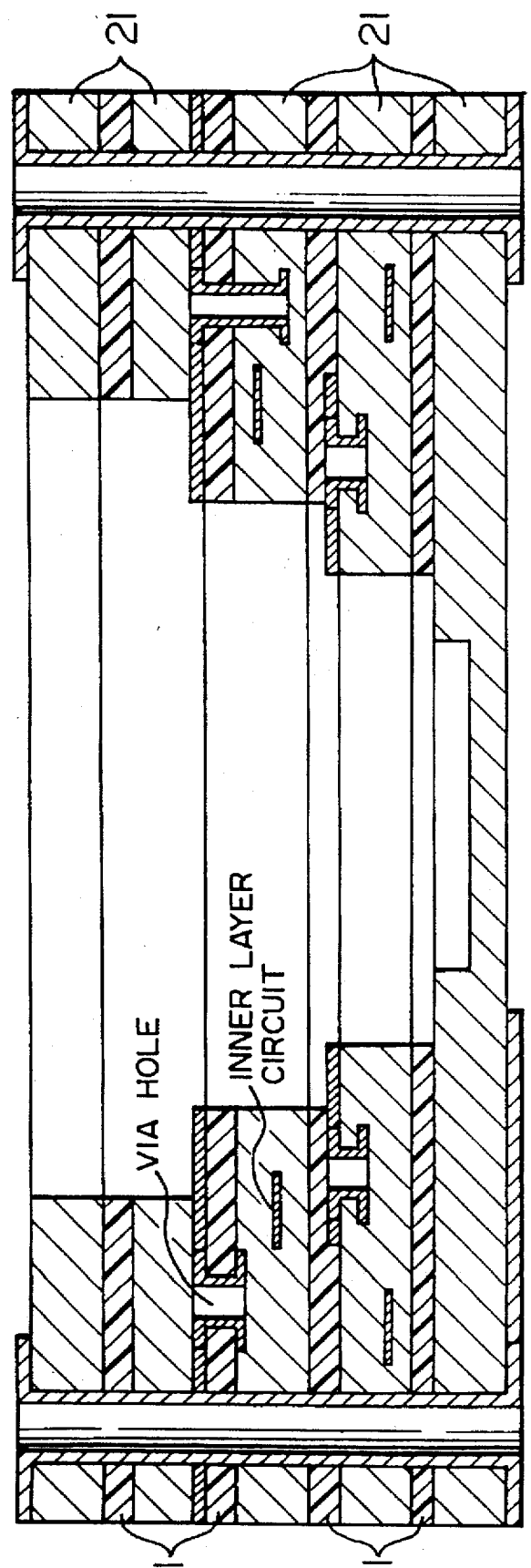
FIG. 10 is a diagrammatic sectional view showing still another embodiment of the present invention.

(11) After laminate molding, the laminate was subjected to drilling for forming through-holes, electroless plating on the inner walls of the holes and the surfaces of the laminate, followed by electroplating, drilling of an opening of the same size as the opening in the fourth insulating substrate at the same part and formation of an opening by end milling machine at the part corresponding to the fifth insulating substrate for forming cavity to provide a multilayer wiring board for chip carrier such as shown in FIG. 10.

COMPARATIVE EXAMPLE 1

A multilayer wiring board was produced by following the same procedure as Example 1 except that an epoxy solder resist ink CCR-506 (trade name, available from Asahi Chemical Laboratory, Ltd.) having a glass transition point of 100°–115° C. was used for the second interlaminar insulating layer.

COMPARATIVE EXAMPLE 2

A multilayer wiring board was produced by following the same procedure as Example 2 except that a polyimide resin-impregnated copper-clad glass cloth laminate MCL-I-671 (trade name, available from Hitachi Chemical Co., Ltd.) was used for the first, second and third insulating substrates, and that a polymeric epoxy adhesive film AS-3000 (mentioned above) having a glass transition point of about 220° C. was used for the first, second and third interlaminar insulating layers.

The thus produced multilayer wiring boards were proof against exfoliation of laminations and void formation in the initial state, but in a 2-minute solder flow test conducted at 260° C., exfoliation and void formation took place at many parts in the wiring boards of the Comparative Examples while no such exfoliation and void formation was seen in the wiring boards according to the Examples of the present invention.

As described above, the present invention provides a multilayer printed wiring board having excellent inhibitory effect against exfoliation and void formation due to heat history of the board and also having high insulation reliability as well as connection reliability of through-holes or via holes, and a process for producing such a wiring board.

What is claimed is:

1. A process for producing a multilayer printed wiring board which comprises placing an interlaminar insulating layer between every adjoining insulating circuit boards having circuits formed on an insulating substrate containing reinforcing fiber, said interlaminar insulating layer being B-staged, having a B-stage resin flow of less than 1%, with the difference in glass transition point between the adjoining insulating layers being not greater than 60° C., and not containing reinforcing fiber; integrally laminating them by heating under pressure, and forming via holes for making electrical connection between two or more layers of circuits.

2. A process for producing a multilayer printed wiring board which comprises forming an etching resist at the part where circuit is to be formed on a laminate of copper-clad insulating substrates containing reinforcing fiber, etching away the unnecessary copper foil to make an insulating circuit board, preparing at least two pieces of such insulating circuit board, placing an interlaminar insulating layer between said insulating circuit boards, said interlaminar insulating layer being B-staged, having a B-stage resin flow of less than 1%, with the difference in glass transition point between the adjoining insulating layers being not greater than 60° C., and not containing reinforcing fiber, integrally laminating them by heating under pressure, providing a plating resist over the whole surface of the obtained laminate, drilling the laminate to form holes to a depth required for connection, and forming a conductor layer by electroless plating.

3. A process for producing a multilayer printed wiring board which comprises forming an etching resist at the part where circuit is to be formed on a laminate of copper-clad insulating substrates containing reinforcing fiber, etching away the unnecessary copper foil to make an insulating circuit board, preparing at least two pieces of such insulating circuit boards, conducting no circuit working on the outermost surface of the insulating circuit board forming the outermost layer, placing between said insulating circuit boards an interlaminar insulating layer which is B-staged, has a B-stage resin flow of less than 1%, with the difference in glass transition point between the adjoining insulating layers being not greater than 60° C., and contains no reinforcing fiber, integrally laminating them by heating under pressure, drilling the obtained laminate to form holes to a depth necessary for connection, forming a plated conductor layer by electroless plating, forming an etching resist on the outermost copper surface, and etching away the unnecessary copper.

4. A process for producing a multilayer printed wiring board which comprises forming an etching resist at the part where circuit is to be formed on a laminate of copper-clad insulating substrates containing reinforcing fiber, etching away the unnecessary copper foil to make an insulating circuit board, preparing at least two pieces of such insulating circuit board, placing between said insulating circuit boards an interlaminar insulating layer which is B-staged, has a B-stage resin flow of less than 1%, with the difference in glass transition point between the adjoining insulating layers being not greater than 60° C., and contains no reinforcing fiber, integrally laminating them by heating under pressure, drilling the obtained laminate, forming a plated conductor layer by electroless plating to make an interlayer circuit board, preparing at least two pieces of such interlayer circuit board, placing between said interlayer circuit boards an interlaminar insulating layer which is B-staged, has a B-stage resin flow of less than 1%, with the difference in glass transition point between the adjoining insulating layers being not greater than 60° C., and contains no reinforcing fiber, integrally laminating them by heating under pressure, providing an etching resist over the whole surface of the obtained laminate, drilling the laminate to form holes to a section where connection is necessary, and forming a plated conductor layer by electroless plating.

5. A process for producing a multilayer printed wiring board which comprises forming an etching resist at the part where interlayer circuit is to be formed on one side of a laminate of copper-clad insulating substrates containing reinforcing fiber, forming an etching resist over the entire surface of the other side, etching away the unnecessary copper foil on the inner layer side to make an insulating circuit board, preparing a pair of such insulating circuit boards, placing therebetween an interlaminar insulating layer which is B-staged, has a B-stage resin flow of less than 1%, with the difference in glass transition point between the adjoining insulating layers being not greater than 60° C., and contains no reinforcing fiber, integrally laminating them by heating under pressure, drilling the obtained laminate to form holes to a section where connection is required, forming a plated conductor layer by electroless plating, forming an etching resist to the shape of circuit on the copper surface on the inner layer side, forming an etching resist over the entirety of the copper surface on the outer side, etching away the unnecessary copper on the embedded side to make two interlayer circuit boards, placing therebetween an interlaminar insulating layer which is B-staged, has a B-stage resin flow of less than 1%, with the difference in glass transition point between the adjoining insulating layers being not greater than 60° C., and contains no reinforcing fiber, integrally laminating them by heating under pressure, drilling the obtained laminate to form holes to a necessary section for connection, forming a plated conductor layer by electroless plating, forming an etching resist to the shape of circuit on the outermost layer, and etching away the unnecessary copper.

6. The process according to claim 1, wherein with reference to the B-staged interlaminar insulating layers and the insulating substrates, the difference in glass transition point between the one with the highest glass transition point and the one with the lowest glass transition point is not greater than 30° C.

7. The process according to claim 1, wherein the B-stage viscoelasticity of the interlaminar insulating layer is in the range of 2,000–5,000 MPa at 30° C. and in the range below 10 MPa at the molding temperature.

8. The process according to claim 1, wherein cavities for housing the semiconductor chips to be mounted later are provided in at least one of the B-staged interlaminar insulating layers or the insulating substrates.

9. The process according to claim 1, wherein the cavities are enlarged in size successively from the one in the interlaminar insulating layer or insulating substrate closest to the part for housing the semiconductor chip to be mounted later, and terminals for making electrical connection with the semiconductor chips to be mounted later are provided in the circuits formed on the surfaces of the interlaminar insulating layers or insulating substrates exposed by the respective cavities.

10. The process according to claim 9, wherein the cavities are through-holes, and a heat sink is provided closing one of the openings of each through-hole.

11. The process according to claim 10, characterized by using a heat sink having a support portion for mounting the semiconductor chips and a brim smaller in thickness than said support portion, forming an opening of substantially the same size as the support portion in the outermost one of the interlaminar insulating layers or insulating substrates, fitting the support portion of the heat sink in said opening, placing in superposed relation the B-staged interlaminar insulating layers and the insulating circuit boards having circuits formed on an insulating substrate, integrally laminating them by heating under pressure, and forming via holes for making electrical connection between two or more layers of circuits.

12. The process according to claim 2, wherein with reference to the B-staged interlaminar insulating layers and the insulating substrates, the difference in glass transition point between the one with the highest glass transition point and the one with the lowest glass transition point is not greater than 30° C.

13. The process according to claim 2, wherein the B-stage viscoelasticity of the interlaminar insulating layers is in the range of 2,000–5,000 MPa at 30° C. and in the range below 10 MPa at the molding temperature.

14. The process according to claim 2, wherein cavities for housing the semiconductor chips to be mounted later are provided in at least one of the B-staged interlaminar insulating layers or the insulating substrates.

15. The process according to claim 2, wherein the cavities are enlarged in size successively from the one in the interlaminar insulating layer or insulating layer closest to the part for housing the semiconductor chip to be mounted later, and terminals for making electrical connection with the semiconductor chips to be mounted later are provided in the circuits formed on the surfaces of the interlaminar insulating layers or the insulating layers exposed by the respective cavities.

16. The process according to claim 15, wherein the cavities are through-holes, and a heat sink is provided closing one of the openings of each through-hole.

17. The process according to claim 16, characterized by using a heat sink having a support portion for mounting the semiconductor chips and a brim smaller in thickness than said support portion, forming an opening of substantially the same size as the support portion of said heat sink in the outermost one of the interlaminar insulating layers or insulating substrates, fitting the support portion of the heat sink in said opening, placing in superposition the B-staged interlaminar insulating layers and the insulating circuit boards having circuits formed on the insulating substrates, integrally laminating them by heating under pressure, and forming via holes for making electrical connection between two or more layers of circuits.

18. The process according to claim 3, wherein with reference to the B-staged interlaminar insulating layers and the insulating substrates, the difference in glass transition point between the one with the highest glass transition point and the one with the lowest glass transition point is not greater than 30° C.

19. The process according to claim 3, wherein the B-staged viscoelasticity of the interlaminar insulating layers is in the range of 2,000–5,000 MPa at 30° C. and in the range below 10 MPa at the molding temperature.

20. The process according to claim 3, wherein cavities for housing the semiconductor chips to be mounted later are provided in at least one of the B-staged interlaminar insulating layers or the insulating substrates.

21. The process according to claim 3, wherein the cavities are enlarged in size successively from the one in the interlaminar insulating layer or insulating substrate closest to the part for housing the semiconductor chips to be mounted later, and terminals for making electrical connection with the semiconductor chips to be mounted later are provided in the circuits formed on the surfaces of the interlaminar insulating layers or the insulating substrates exposed by the respective cavities.

22. The process according to claim 21, wherein the cavities are through-holes, and a heat sink is provided closing one of the openings of each through-hole.

23. The process according to claim 22, characterized by using a heat sink having a support portion for mounting the semiconductor chips and a brim smaller in thickness than the support portion, forming an opening of substantially the same size as the support portion of said heat sink in the outermost one of the interlaminar insulating layers or the insulating substrates, fitting the support portion of said heat sink in said opening, placing in superposition the B-staged interlaminar insulating layers and the insulating circuit boards having circuits formed on the insulating substrates, integrally laminating them by heating under pressure, and forming via holes for making electrical connection between two or more layers of circuits.

24. The process according to claim 11, wherein an unevenness for increasing adhesive force is provided on at least the side of the brim portion of the heat sink to be bonded to an insulating layer.

25. The process according to claim 8, wherein terminals for making electrical connection with other wiring boards are provided on one side and openings for mounting the semiconductor chips are formed in the same side or in the opposite side.

26. The process according to claim 15, wherein the terminals for making electrical connection with other wiring boards are pins.

27. The process according to claim 15, wherein lands for making electrical connection by solder balls are provided as terminals for making electrical connection with other wiring-boards.

28. The process according to claim 1, wherein the laminate molding temperature is 165°–200° C.

29. The process according to claim 1, wherein at least one of the interlaminar insulating layers or insulating substrates having via holes running therethrough is composed of a thermosetting resin comprising 40–70% by weight of a polyimide, 15–45% by weight of a bismaleimide-diamine reaction product and 15–45% by weight of an epoxy resin and represented by the following formula (1):

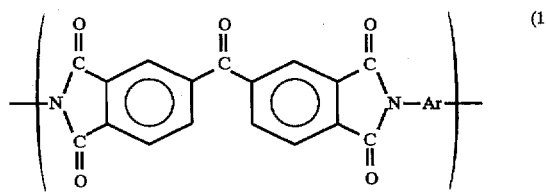

wherein Ar is a group represented by the following formula (2) or (3), the group of the formula (2) being contained in an amount of 10–98% by mole and the group of the formula (3) being contained in an amount of 90–5% by mole:

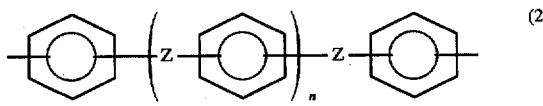

wherein Z represents —C(=O)—, —SO$_2$—, —O—, —S—, —(CH$_2$)$_m$—, —NH—C(=O)—, —C(CH$_3$)$_2$—, —C(CF$_3$)$_2$—, —C(=O)—O— or a bond; n and m are each an integer of 1 or greater; Z's may be the same or different from each other, and hydrogen in each benzene ring may be substituted with an appropriate substituent;

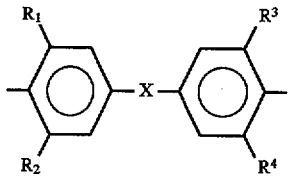 (3)

wherein $R_1$, $R_2$, $R_3$ and $R_4$ represent independently hydrogen, $C_{1-4}$ alkyl group or alkoxy group, with at least two of them being alkyl group or alkoxy group; and X represents —$CH_2$—, —$C(CH_3)_2$—, —O—, —$SO_2$—, —C(=O)— or —NH—C(=O)—.

30. The process according to claim 8, wherein the openings designed to constitute cavities for housing the semiconductor chips to be mounted later are formed in at least one of the interlaminar insulating layers or the insulating substrates, and the structural members are integrally laminated by heating under pressure to provide a laminate structure of flat panel/protective film/combination of B-staged interlaminar insulating layers and insulating circuit boards having circuits formed on insulating substrates/cushion material/molded article having openings of the same size as cavities/flat panel.

* * * * *